United States Patent
Melul et al.

(10) Patent No.: US 12,035,522 B2
(45) Date of Patent: Jul. 9, 2024

(54) BIT-ERASABLE EMBEDDED SELECT IN TRENCH MEMORY (eSTM)

(71) Applicant: STMicroelectronics (Rousset) SAS, Rousset (FR)

(72) Inventors: Franck Melul, Sanary sur Mer (FR); Abderrezak Marzaki, Aix en Provence (FR); Madjid Akbal, Trets (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 219 days.

(21) Appl. No.: 17/700,323

(22) Filed: Mar. 21, 2022

(65) Prior Publication Data

US 2022/0328509 A1 Oct. 13, 2022

(30) Foreign Application Priority Data

Apr. 13, 2021 (FR) ...................................... 2103797

(51) Int. Cl.
  *H10B 41/35* (2023.01)
  *G11C 16/16* (2006.01)
  *G11C 16/26* (2006.01)
  *G11C 16/34* (2006.01)
  *H01L 21/28* (2006.01)
  *H01L 29/66* (2006.01)
  (Continued)

(52) U.S. Cl.
  CPC ............ *H10B 41/35* (2023.02); *G11C 16/16* (2013.01); *G11C 16/26* (2013.01); *G11C 16/34* (2013.01); *H01L 29/66825* (2013.01); *H01L 29/7884* (2013.01); *H01L 29/40114* (2019.08); *H01L 29/7883* (2013.01); *H10B 41/10* (2023.02)

(58) Field of Classification Search
  CPC ........ H10B 41/35; H10B 41/10; H10B 41/30; H10B 43/30; G11C 16/16; G11C 16/26; G11C 16/34; G11C 16/06; G11C 16/10; H01L 29/66825; H01L 29/7884; H01L 29/40114; H01L 29/7883; H01L 29/42336
  See application file for complete search history.

(56) References Cited

U.S. PATENT DOCUMENTS 4,686,558 A  8/1987 Adam
10,818,669 B2 * 10/2020 Marzaki ............. H10B 12/0387
(Continued)

OTHER PUBLICATIONS

Niel, S. et al., "Embedded Select in Trench Memory (eSTM), Best in Class 40nm Floating Gate Base Cell; a Process Intergration Challenge," 2018 IEEE International Electron Devices Meeting (IEDM), IEEE, XP033500864, Dec. 1, 2018, 4 pages.

*Primary Examiner* — Allison Bernstein
(74) *Attorney, Agent, or Firm* — Slater Matsil, LLP

(57) ABSTRACT

In an embodiment a memory cell includes a first doped well of a first conductivity type in contact with a second doped well of a second conductivity type, the second conductivity type being opposite to the first conductivity type, a third doped well of the second conductivity type in contact with a fourth doped well of the first conductivity type, a first wall in contact with the second and fourth wells, the first wall including a conductive or semiconductor core and an insulating sheath, a stack of layers including a first insulating layer, a first semiconductor layer, a second insulating layer and a second semiconductor layer at least partially covering the second and fourth wells and a third semiconductor layer located below the second and fourth wells and the first wall.

19 Claims, 10 Drawing Sheets

(51) Int. Cl.
*H01L 29/788* (2006.01)
*H10B 41/10* (2023.01)

(56) References Cited

U.S. PATENT DOCUMENTS

| | | | |
|---|---|---|---|
| 10,971,578 B2* | 4/2021 | Marzaki | H01L 21/283 |
| 2002/0153546 A1* | 10/2002 | Verhaar | H10B 69/00 |
| | | | 257/296 |
| 2006/0158930 A1* | 7/2006 | Thomas | G11C 16/12 |
| | | | 365/177 |
| 2015/0117117 A1 | 4/2015 | La Rosa et al. | |
| 2019/0198108 A1 | 6/2019 | Ning et al. | |

* cited by examiner

BIT-ERASABLE EMBEDDED SELECT IN TRENCH MEMORY (eSTM)

CROSS-REFERENCE TO RELATED APPLICATIONS

This application is a translation of and claims the priority of French patent application number "FR2103797", filed on Apr. 13, 2021, entitled "Cellule mémoire programmable et effaçable", which is incorporated herein by reference in its entirety.

TECHNICAL FIELD

The present disclosure relates to electronic devices and more precisely memory devices, their manufacturing methods, and their methods of use.

BACKGROUND

There are many types of memory cells. In particular, there are memory cells called eSTM (embedded Select in Trench Memory). An eSTM-type memory cell is a rewritable memory cell typically used in flash-type memory circuits.

eSTM memory cells are arranged in arrays forming rows and columns. The cells of the same row are coupled together by a connection element corresponding to a bit line. The cells of a same column are coupled together by a connection element corresponding to a word line. The cells of the array may be programmed and read bit by bit, that is, cell by cell. However, eSTM cells are erased row by row.

SUMMARY

Embodiments provide an eSTM-type memory cell capable of being erased bit by bit.

Embodiments provide an eSTM-type memory cell capable of being erased faster.

Embodiments provide a more reliable eSTM-type memory cell.

Embodiments provide an eSTM-type memory cell capable of being controlled by lower voltages than known eSTM-type memory cells.

Various embodiments overcome all or part of the disadvantages of known eSTM-type memory cells.

In an embodiment a memory cell comprising:
a first doped well of a first conductivity type, in contact with a second doped well of a second conductivity type, the second conductivity type being opposite to the first conductivity type;
a third doped well of the second conductivity type, in contact with a fourth doped well of the first conductivity type;
a first wall in contact with the second and fourth wells, the first wall comprising a conductive or semiconductor core and an insulating sheath;
a stack of a first insulating layer, of a first semiconductor layer, of a second insulating layer, and of a second semiconductor layer at least partially covering the second and fourth wells; and
a third semiconductor layer having the second and fourth wells and the wall resting thereon.

According to an embodiment, the first conductivity type is type N and the second conductivity type is type P.

According to an embodiment, the second and fourth wells are separated by the first conductive wall.

According to an embodiment, the stack of layers covers the first wall.

According to an embodiment, the third layer is separated from the fourth well by a doped semiconductor well of the second conductivity type.

According to an embodiment, the second and fourth wells are separated by a second insulating wall.

According to an embodiment, the stack of layers covers the second wall.

Another embodiment provides a memory comprising an array of memory cells such as previously described, wherein each column of the array comprises a second semiconductor layer and a first wall common to the cells of the column.

In another embodiment a method for controlling a memory cell such as previously described, comprising a programming step, during which:
the second, third, and fourth wells and the third layer are at a first reference potential;
the first well is set to a second positive potential, greater than the first reference potential;
the second layer is set to a third positive potential, greater than the second positive potential; and
the first wall is set to a fourth potential equal to the threshold voltage of a transistor equivalent to the first, second, and third wells and to the stack of layers.

According to an embodiment, the first reference potential is the ground, the second positive potential is substantially equal to 5 V, the third potential is substantially equal to 12 V, and the fourth potential is in the range from 0.5 V to 1.5 V.

Another embodiment provides a method of controlling a memory cell such as previously described, comprising a readout step during which:
the second, third, and fourth wells and the second semiconductor layer and the third layer are at a fifth reference potential;
the first well is set to a sixth positive potential, greater than the fifth reference potential;
the first wall is set to a seventh positive potential, greater than the sixth positive potential.

According to an embodiment, the fifth reference potential is the ground, the sixth positive potential is substantially equal to 0.7 V, and the seventh positive potential is substantially equal to 3 V.

In yet another embodiment a method for controlling a memory cell such as previously described, comprising an erasing step during which:
the first, second, and third wells and the third layer are at an eighth reference potential;
the fourth well is set to a ninth potential, smaller than the eighth reference potential;
the second semiconductor layer is set to a tenth potential, smaller than the ninth potential; and
the first wall is set to an eleventh potential equal to the threshold voltage of a transistor equivalent to the second, third, and fourth wells and to the stack of layers.

According to an embodiment, the eighth reference potential is the ground, the ninth potential is substantially equal to −5 V, the tenth potential is substantially equal to −10 V, and the eleventh potential is in the range from −1.5 V to −0.5 V.

According to an embodiment, the eighth reference potential is substantially equal to 10 V, the ninth potential is substantially equal to 5 V, the tenth potential is the ground, and the eleventh potential is in the range from 5 V to 15 V.

According to an embodiment, the eighth reference potential is substantially equal to 5 V, the ninth potential is the ground, the tenth potential is substantially equal to −5 V, and the eleventh potential is in the range from 0 V to 10 V.

According to an embodiment, the programming step and the erasing step have substantially the same duration.

In some embodiments a method for manufacturing a memory cell such as previously described, comprises
 a. the forming of the third semiconductor layer by implantation of dopants into a semiconductor substrate;
 b. the forming of the second well by implantation of dopants into the substrate;
 c. the forming of the fourth well by implantation of dopants into the substrate;
 d. the forming of the first wall between the second and third wells;
 e. the forming of the stack on a portion of the second and fourth wells and on the first wall;
 f. the forming of the first well by implantation of dopants into the second well; and
 g. the forming of the third well by implantation of dopants into the fourth well.

Another embodiment provides a method of manufacturing a first memory cell such as previously described and a second memory cell of eSTM type, wherein the first memory cell is formed by steps a, b, c, d, e, f, and g of the method such as previously described, the second memory cell being formed by steps a, b, d, e, f.

Another embodiment provides a method of manufacturing a first memory cell such as previously described and of a transistor, the first cell being formed by the previously-described method, wherein the gate of the transistor is formed by step e and the drain and source regions are formed by step f or g.

Another embodiment provides a method of manufacturing a first memory cell such as previously described, a transistor, and a second eSTM-type memory cell, the first cell being formed by the previously-described method, the second cell being formed by the previously-described method, and the transistor being formed by the previously-described method.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
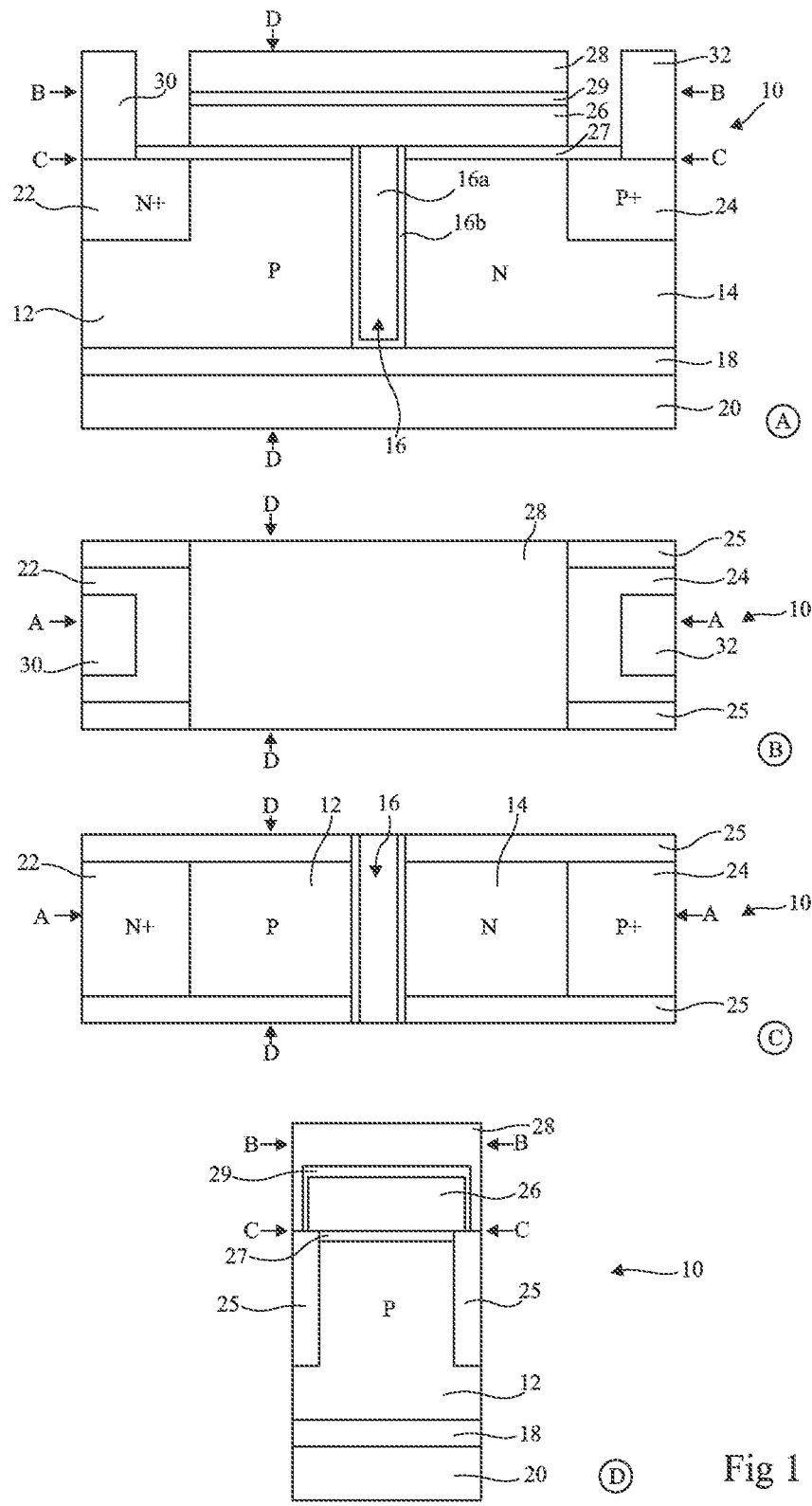
FIG. 1 shows views A, B, C, and D of an embodiment of a memory cell.

FIG. 1 shows views A, B, C, and D of an embodiment of a memory cell 10. More precisely, FIG. 1 comprises:
 a cross-section view A along a plane A-A of views B and C;
 a top view B along a plane B-B of views A and D;
 a top view C along a plane C-C of views A and D; and
 a cross-section view D along a plane D-D of views B and C.

Planes B-B and C-C are parallel to each other and orthogonal to planes A-A and D-D. Plane A-A is orthogonal to planes B-B, C-C, and D-D. Similarly, plane D-D is orthogonal to planes A-A, B-B, and C-C. Plane A-A corresponds to the direction of a bit line of an array of identical or similar elementary cells. Plane D-D corresponds to the direction of a word line of the array.

Memory cell 10 comprises a well 12. Well 12 is made of a semiconductor material, for example, of silicon. Well 12 is P-type doped. Well 12 is for example boron-doped. The dopant concentration in well 12 is for example in the range from $10^{14}$ to $5\times10^{15}$ at·cm^(−3).

Cell 10 further comprises a well 14. Well 14 is made of a semiconductor material, for example, of silicon. Well 14 is N-type doped. Well 14 is for example phosphorus-doped. The dopant concentration in well 14 is for example in the range from $10^{14}$ to $5\times10^{15}$ at·cm^(−3).

Cell 10 further comprises a wall 16 separating wells 12 and 14. Wall 16 for example comprises a core 16a, for example, made of a metal or of a semiconductor material, preferably of polysilicon, and an insulating sheath 16b surrounding core 16a, for example, made of silicon oxide. In particular, insulating sheath 16b separates core 16a from wells 12 and 14. Wall 16 is for example made of polysilicon. Preferably, wells 12 and 14 are entirely separated by wall 16. Wall 16 preferably extends at least along the entire height of wells 12 and 14. Thus, wells 12 and 14 are preferably not in contact with each other. Wells 12 and 14 are preferably in contact with wall 16.

Preferably, wells 12 and 14 and wall 16 have lower surfaces coplanar to each other. Preferably, cell 10 comprises a layer 18 having the lower surfaces of wells 12 and 14 and of wall 16 resting thereon. In this example, the lower surfaces of wells 12 and 14 and of wall 16 are in contact with the upper surface of layer 18. Layer 18 is preferably made of a semiconductor material, for example, silicon, for example, N-type doped silicon. Layer 18 rests on a P-type doped substrate 20. Substrate 20 is for example made of a semiconductor material, for example, boron-doped.

Cell 10 comprises a well 22 located in an upper portion of well 12. Well 22 is made of a semiconductor material, for example of silicon. Well 22 is N-type doped (N+). Well 22 is for example phosphorus-doped. The dopant concentration in well 22 is greater than the dopant concentration in well 14. The dopant concentration in well 22 is for example in the range from $10^{18}$ to $10^{20}$ at·cm^(−3).

Well 22 is separated from wall 16 by a portion of well 12. In other words, a portion of the well 12 is located between well 22 and wall 16. Wall 16 and well 22 are thus not in contact with each other. Well 22 extends from the upper surface of well 12. The upper surface of well 22 is preferably coplanar with the upper surface of wall 16 and with the upper surface of the portion of well 12 located between well 22 and wall 16.

Similarly, cell 10 comprises a well 24 located in an upper portion of well 14. Well 24 is made of a semiconductor material, for example, of silicon. Well 24 is P-type doped (P+). Well 24 is for example, boron-doped. The dopant concentration in well 24 is greater than the dopant concentration in well 12. The dopant concentration in well 24 is for example in the range from $10^{18}$ to $10^{20}$ at·cm^(−3).

Well 24 is separated from wall 16 by a portion of well 14. In other words, a portion of the well 14 is located between well 24 and wall 16. Wall 16 and well 24 are thus not in contact with each other. Well 24 extends from the upper surface of well 14. The upper surface of well 24 is preferably coplanar with the upper surface of wall 16 and with the upper surface of the portion of well 14 located between well 24 and wall 16.

The plane C-C of view C illustrates the upper surfaces of wells 12, 14, 22, 24 and of wall 16. In plane C-C, the cell thus comprises, from left to right, well 22, well 12, wall 16, well 14, and well 24.

The N or P doping type of well 12 is the type opposite to the doping type of well 14. Similarly, the doping type of well 22 is the type opposite to the doping type of well 24. Further, the doping type of well 22 is the type opposite to the doping type of well 12. The doping type of well 24 is the type opposite to the doping type of well 14. Thus, wells 22 and 14 have identical N or P doping types and wells 24 and 12 have identical doping types.

Preferably, the dimensions of wells 12 and 14 are substantially identical. Similarly, the dimensions of wells 22 and 24 are substantially identical.

Cell 10 is separated from the neighboring cells belonging to different lines by insulating walls 25. Insulating walls 25 are for example made of silicon oxide. Insulating walls 25 preferably extend from the plane of the upper surfaces of wells 22 and 24, that is, plane C-C. Walls 25 preferably extend all along the cell in the row direction. Thus, walls 25 extend along wells 22, 24, 12, and 14. Walls 25 are preferably crossed by wall 16. Preferably, walls 25 extend along a height smaller than the height of wall 16, that is, a height smaller than the distance between plane C-C and layer 18. Thus, walls 25 preferably do not extend along the entire height of wells 12 and 14. This enables to electrically connect the wells 12 and 14 of a cell 10 to neighboring cells 10. Walls 25 are preferably separated from layer 18 by a portion of well 12 or of well 14. Preferably, walls 25 extend along a height greater than the height of wells 22 and 24.

Cell 10 further comprises a stack of an insulating layer 27, of a layer 26 made of a metal or of a semiconductor material, for example, of polysilicon, of an insulating layer 29, and of a layer 28 of a metal or of a semiconductor material, for example, of polysilicon. Preferably, layers 27 and 29 are made of different materials. For example, layer 27 is made of silicon oxide and layer 29 is a stack of a silicon oxide layer, of a silicon nitride layer, and of a silicon oxide layer. Preferably, layers 26 and 28 are made of the same material, for example, of polysilicon.

Layer 27 rests on the upper surface of wells 12, 14, 22, and 24. Layer 26 rests on layer 27. Preferably, layer 26 has horizontal dimensions smaller than the horizontal dimensions of layer 27, that is, smaller dimensions in the bit and word line directions. Preferably, layer 27 continuously extends all over the upper surface of wells 12 and 14 and at least partially over the upper surface of wells 22 and 24. Layer 27 extends, in the column direction, across the entire width of wells 22 and 24. Preferably, layer 27 extends from one of walls 25, preferably from a lateral surface of one of walls 25, to the other wall 25 of the cell, preferably all the way to a lateral surface of the other wall 25. Layer 27 preferably extends in the array row direction, from wall 16. Layer 27 separates layer 26 from wells 12 and 14 and from wall 16. Preferably, layer 26 continuously extends in front of the entire upper surface of wells 12 and 14. Layer 26 extends, in the column direction, across the entire width of wells 22 and 24. Preferably, layer 26 extends from one of walls 25 to another wall 25 of the cell. Layer 26 preferably extends in the array row direction, from well 22 to well 24. Preferably, layer 26 extends from the level of the contact area between wells 12 and 22 to the level of the contact area between wells 14 and 24. Preferably, layer 26 does not extend in front of wells 22 and 24.

Layer 29 preferably entirely covers layer 26. Preferably, layer 29 covers the upper surface of layer 26 and lateral surfaces of layer 26, for example, the lateral surfaces of layer 26 in the array column direction. Preferably, layer 29 has a dimension, in the array row direction, substantially equal to the dimension of layer 26 in the row direction.

Layer 28 preferably entirely covers layer 29. Layer 28 is separated from layer 26 by layer 29. Preferably, layer 28 has a dimension, in the row direction, substantially equal to the dimension of layer 26 in the row direction.

Preferably, the dimension of layer 28 in the column direction is greater than the dimension of layer 26 in the column direction. Preferably, layer 28 is common to a plurality of cells of a same column, preferably to all the cells of a column. Thus, layer 28 preferably covers the layer 26 of a plurality of cells of a same column, and covers the walls 25 separating said cells.

The cell further comprises contact elements 30 and 32, for example, conductive vias. Elements 30 and 32 are for example made of a metal. Element 30 is in contact with well 22 and element 32 is in contact with well 24. Elements 30 and 32 are not in contact with layers 26 and 28. Element 30 is preferably not in contact with well 12. Element 32 is preferably not in contact with well 14. Elements 30 and 32 are each coupled to a connection element forming a bit line.

Cell 10 is formed of two assemblies of two MOSFET (Metal Oxide Semiconductor Field Effect Transistor) transistors in series. An assembly comprises N-channel transistors formed by layer 18, well 12, and well 22, layers 26, 27, 28, and 29 forming the gate. The other assembly comprises P-channel transistors formed by well 12, well 14, and well 24, layers 26, 27, 28, and 29 forming the gate.

Layer 18 is preferably common to all the memory cells of the type of cell 10 in a same array of cells.

Wall 16 is preferably common to all the cells of the array column. Wall 16 extends from one cell to a neighboring cell by crossing insulating walls 25.

The row of the cell array comprises, for example, neighboring cells symmetrical to one another according to a plane of symmetry parallel to plane D-D and for example located on the left-hand side of view A. Wells 12 and 22 then extend leftwards in view A to form shapes similar to the shapes shown in FIG. 1. Similarly, well 24 and well 14 are for example common with a neighboring cell of the same row of the array located on the right-hand side in view A.

Preferably, the wells 22 of a same row of the array are coupled together via elements 30 and possibly other connection elements, not shown. Similarly, the wells 24 of a same row of the array are coupled together via elements 32 and possible other connection elements, not shown.

Further, well 12 and well 14 are preferably common to all the cells of the array column. Wells 12 and 14 and extend under walls 25. For example, wells 12 and 14 are each coupled by an end-of-line contact to a node of application of a voltage.

Figure 2:
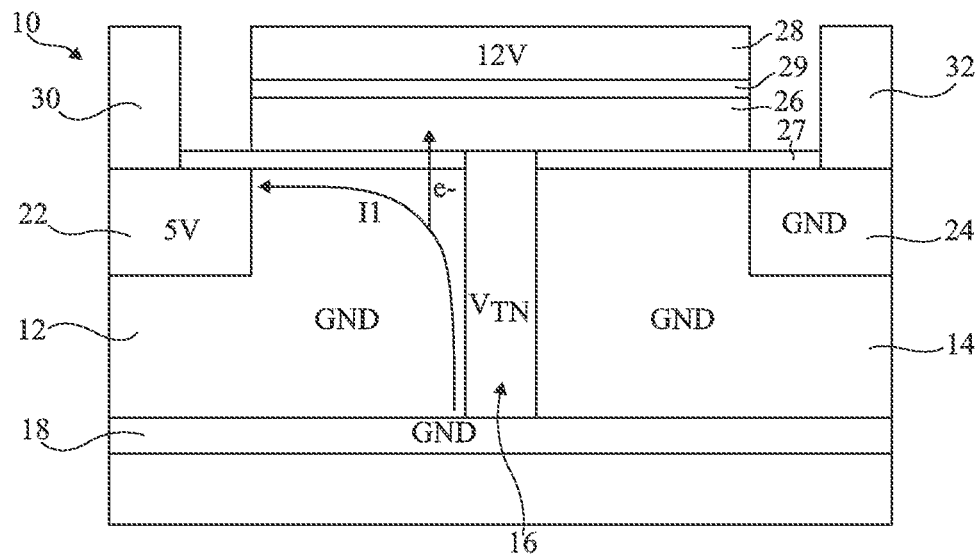
FIG. 2 illustrates a step of programming of the cell of FIG. 1.

FIG. 2 illustrates a step of programming of the cell of FIG. 1. It thus is a step during which the memory cell will switch from a first binary value, for example, value 0, to a second binary value, for example value 1.

During the programming of cell 10, wells 12, 14, and 24 are set to a same reference potential GND, for example, the ground, that is, a 0-V potential. Layer 18 is likewise set to reference potential GND. Well 22 is set to a potential greater than the potential to which layer 18 is set. Well 22 is preferably set to a positive potential, for example, a potential in the range from 3 V to 10 V, for example, substantially equal to 5 V. Further, layer 28 is set to a potential greater than the potential to which well 22 is set. Layer 28 is for example set to a potential in the range from 10 V to 15 V, for example, substantially equal to 12 V.

Wall 16 is set to a potential substantially equal to a threshold voltage $V_{TN}$ of the transistor formed by wells 12 and 22 and layers 18, 26, and 28, that is, the P-channel transistor. Wall 16 is set to a potential enabling to turn off the P-channel transistor of the cell. Wall 16 is thus set to a potential preferably in the range from 0.5 V to 1.5 V, preferably substantially equal to 1 V.

More generally, the different portions of the cell are set to potentials enabling, during the programming of cell 10, to form a current I1, shown by an arrow in FIG. 2, between layer 18 and well 22, along wall 16 and layer 26. The potentials of well 22, of layers 28 and 18, and of wall 16 are such that a hot carrier injection phenomenon appears. Thus, carriers, here electrons e−, thus enter layer 26 through layer 27 and remain trapped therein. This is shown by an arrow in FIG. 2.

Figure 3:
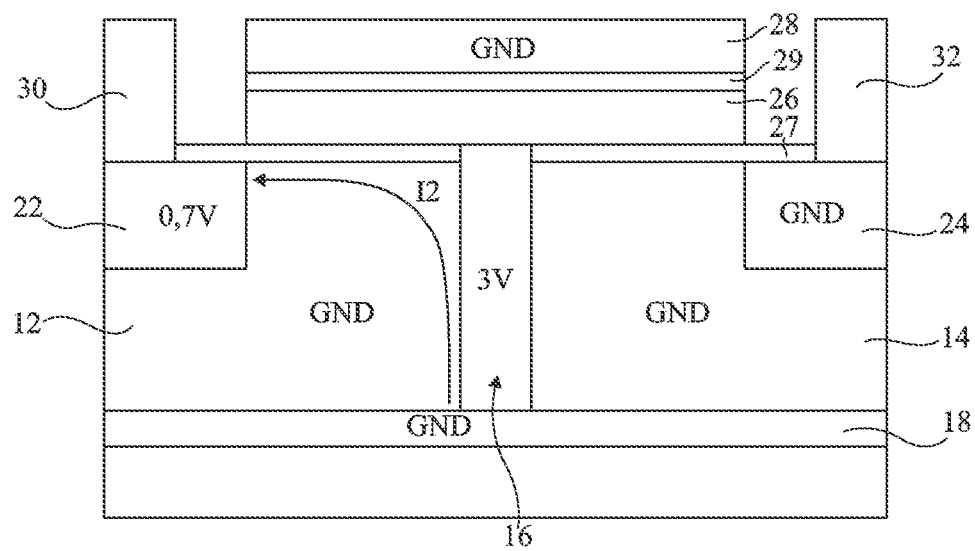
FIG. 3 illustrates a step of reading from the cell of FIG. 1.

FIG. 3 illustrates a step of reading from the cell of FIG. 1.

During this readout step, wells 12, 14, and 24 are set to a same reference potential GND, for example, the ground. Layer 18 is likewise set to reference potential GND. Well 22 is set to a potential greater than the potential to which layer 18 is set. Well 22 is preferably set to a positive potential, for example, a potential in the range from 0 V to 1 V, for example, substantially equal to 0.7 V. Further, layer 28 is set to a potential smaller than the potential to which well 22 is set, preferably to reference potential GND. Wall 16 is set to a potential greater than the potential to which well 22 is set. For example, wall 16 is set to a potential in the range from 1V to 5V.

More generally, the different portions of the cell are set to potentials enabling, during the readout step:
to form a current I2, shown by an arrow in FIG. 3, between layer 18 and well 22 if a programming step trapping carriers, here electrons, in layer 26 has not been carried out and there thus are no carriers, here electrons, in layer 26; and
not to form current between layer 18 and well 22 if carriers, here electrons, are trapped in layer 26.

Binary data can thus be read. If, during the described readout step, a current is generated between layer 18 and well 22, the memory cell contains a first binary value, for example, value 0 and if the current is not generated between layer 18 and well 22, the memory cell contains a second binary value, for example, value 1.

Figure 4:
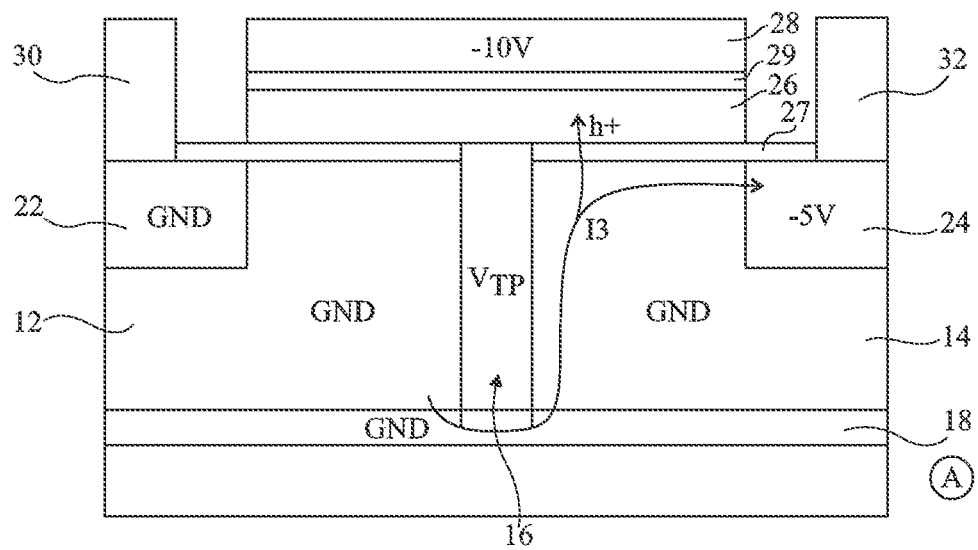
FIG. 4 shows views A, B, and C illustrating different examples of steps of erasing of the cell of FIG. 1.
Figure 4:
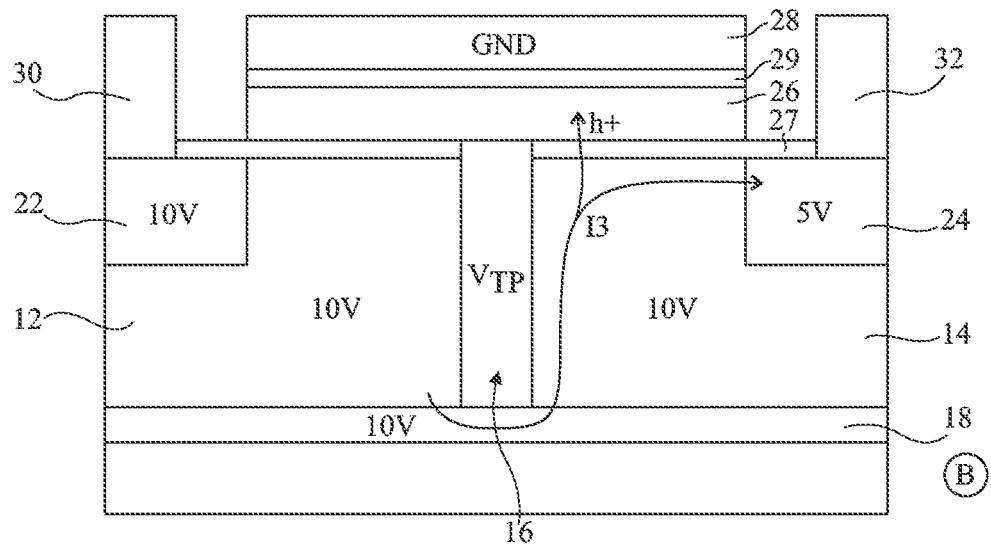
Figure 4:
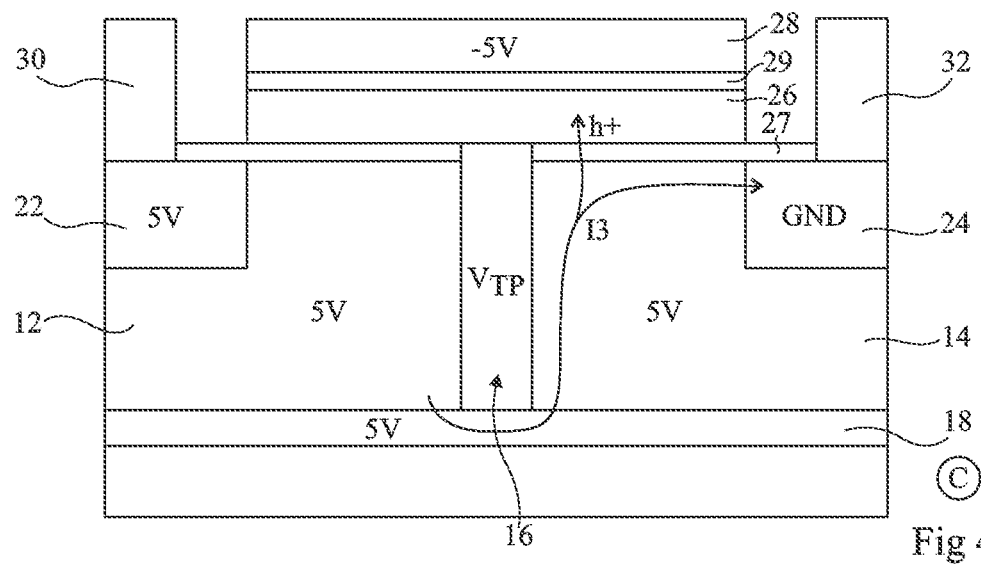

FIG. 4 shows views A, B, and C illustrating different examples of steps of erasing of the cell of FIG. 1.

View A shows a first example of a step of erasing of cell 10. During this step, wells 12, 14, and 22 and layer 18 are set to reference potential GND. Further, layer 28 is set to a negative potential, substantially equal to −10 V. Well 24 is set to a negative potential, substantially equal to −5 V. Wall 16 is set to a potential preferably in the range from −0.5 V to −1.5 V, preferably substantially equal to −1 V.

View B shows a second example of a step of erasing of cell 10. During this step, wells 12, 14, and 22 and layer 18 are set to a positive potential, substantially equal to 10 V. Further, layer 28 is set to reference potential GND. Well 24 is set to a positive potential, substantially equal to 5 V. Wall 16 is set to a potential preferably in the range from 5 V to 15 V, preferably substantially equal to 9 V.

View C shows a third example of a step of erasing of cell 10. During this step, wells 12, 14, and 22 and layer 18 are set to a positive potential, substantially equal to 5 V. Further, layer 28 is set to a negative potential, substantially equal to −5 V. Well 24 is set to reference potential GND. Wall 16 is set to a potential preferably in the range from 0 V to 10 V, preferably substantially equal to 4 V.

More generally, during a step of erasing of cell 10, the potentials to which wells 12, 14, and 22 and layer 18 are set are substantially equal to one another. Wells 12, 14, and 22 and layer 18 are set to a first potential. Further, wall 16 is set to a potential substantially equal to a threshold voltage $V_{TP}$ of the transistor formed by wells 12, 14, and 24 and layers 18, 26, and 28, that is, the P-channel transistor.

Further, well 24 is set to a second potential, smaller than the first potential. Layer 28 is set to a third potential, smaller than the second potential. Preferably, the difference between the first potential and the second potential is in the range from 2 V to 7 V, preferably substantially equal to 5 V. Similarly, the difference between the second potential and the third potential is preferably in the range from 2 V to 7 V, preferably substantially equal to 5 V. The difference between the first potential and the second potential is preferably substantially equal to the difference between the second potential and the third potential.

More generally, the different portions of the cell are set to potentials enabling, during the erasing step, to form a current I3 shown by an arrow in the views of FIG. 4, between well 12 and well 24 through layer 18, along wall 16 and layer 26. The potentials of well 24, of well 12, of layers 28 and 18, and of wall 16 are such that a hot carrier injection phenomenon appears. Thus, carriers, here holes h+, enter layer 26 through layer 27, by tunnel effect, and remain trapped therein. This is shown by an arrow in the views A, B, and C of FIG. 4.

The holes trapped in layer 26 compensate for the electrons trapped in layer 26 during a programming step. Thus, during a readout step subsequent to the erasing step and in the absence of a new programming step, the absence of electrons ensures that current I2 will be formed.

Preferably, the number of holes generated and trapped in layer 26 during the erasing step is substantially equal to the number of electrons trapped in layer 26 during the previous programming step, so that the holes compensate for the electrons. For this purpose, the duration of the erasing step is preferably substantially the same as that of the programming step.

In a memory array of cells such as cell 10, it is possible to erase cells bit by bit. Indeed, to erase cell 10, layer 28 and wall 16, common to the column of cell 10, are respectively set to the third potential and to potential $V_{TP}$. Further, well 24, coupled to the wells 24 of the array row of cell 10 by a connection element, not shown, forming the bit line, is set to the second potential. The other layers 28, the other walls 16, and the other wells 24 are for example all set to the first potential or are each set to a potential different from the potential corresponding to the erasing. Thus, the erasing is only performed in a cell.

Figure 5:
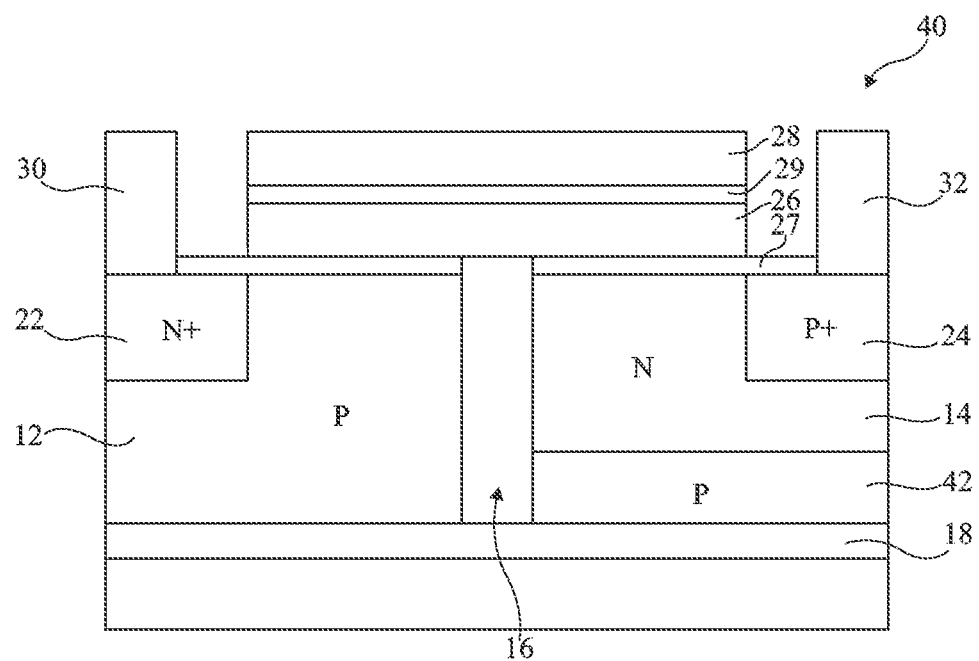
FIG. 5 shows another embodiment of a memory cell.

FIG. 5 shows another embodiment of a memory cell 40.

Memory cell 40 differs from the cell 10 of FIG. 1 in that well 14 is separated from layer 18 by a well 42. Well 42 is made of a P-type doped semiconductor material (that is, a doping opposite to that of well 14), for example, doped with boron atoms. The doping concentration is for example in the range from $10^{14}$ et $5\times10^{15}$ at·cm^(−3).

Preferably, well 14 is totally separated from layer 18 by well 42. Thus, well 14 is not in contact with layer 18.

Well 42 extends from layer 18. Well 42 preferably extends along a height smaller than the distance between layer 18 and well 24. Thus, well 42 is preferably separated from well 24 by a portion of well 14. Further, well 42 preferably extends along a height smaller than the distance between layer 18 and insulating walls 25, not shown in FIG. 5. Thus, well 14 preferably extends along a height greater than the height of walls 25. This enables to interconnect well 14 with the well 14 of a neighboring cell. Well 14 thus comprises portions located under walls 25, in such a way that well 14 can be common to a plurality of cells, preferably to all the cells, of the column.

Preferably, well 42 is common between the cells of a same column. Well 42 is for example common between two neighboring cells of a same row of the array.

According to the embodiment of FIG. 5, cell 40 comprises an N-channel MOSFET transistor formed by layer 18, well 12, and well 22, layers 26, 27, 28, and 29 forming the gate. Cell 40 comprises a P-channel MOSFET transistor formed by well 42, well 14, and well 24, layers 26, 27, 28, and 29 forming the gate.

The operation of cell 40 is identical to the operation of cell 10, well 42 being set to the same potential as well 12, except for the fact that during the erasing step, current I3 is located between well 42 and well 24 and not between well 12 and well 24.

An advantage of the embodiment of FIG. 5 is that it is possible to select the effective length of the P-channel transistor by selecting the height of well 42.

Figure 6:
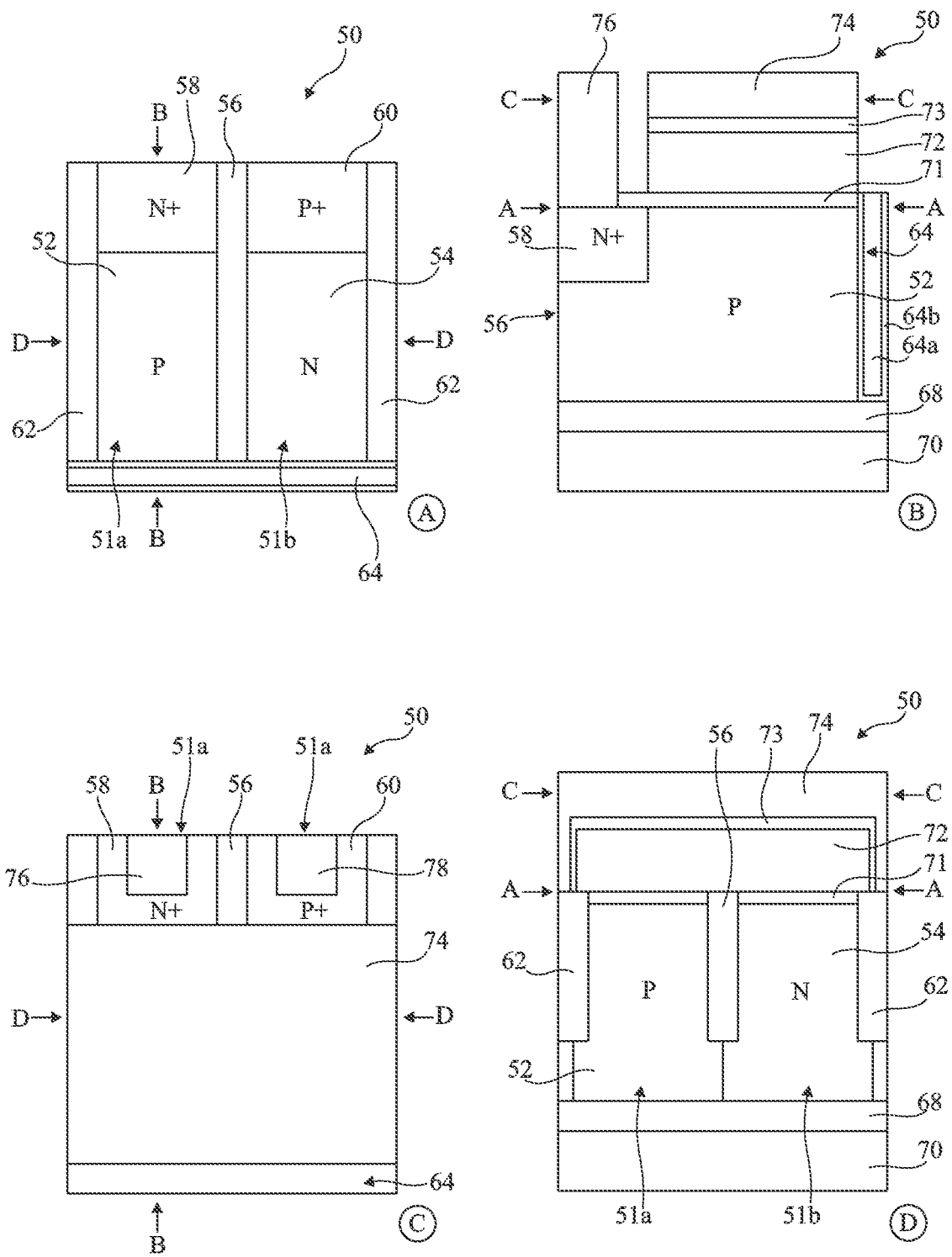
FIG. 6 shows views A, B, C, and D of another embodiment of a memory cell.

FIG. 6 shows views A, B, C, and D of another embodiment of a memory cell 50.

More precisely, FIG. 6 comprises:
a top view A along a plane A-A of views B and D;
a cross-section view B along a plane B-B of views A and C;
a top view C along a plane C-C of views B and D; and
a cross-section view D along a plane D-D of views A and C.

Planes A-A and C-C are parallel to each other and orthogonal to planes B-B and D-D. Plane B-B is orthogonal to planes A-A, C-C, and D-D. Similarly, plane D-D is orthogonal to planes A-A, B-B, and C-C. Plane B-B corresponds to the direction of a bit line of the array of memory cells. Plane D-D corresponds to the direction of a column of the array of memory cells.

The memory cell 50 comprises two semiconductor blocks 51a and 51b. Blocks 51a and 51b are preferably next to each other. Blocks 51a and 51b are preferably identical to each other to within the conductivity type.

Semiconductor block 51a comprises a well 52. Well 52 is similar to the well 12 of FIG. 1. Thus, well 52 is made of a semiconductor material, for example, of silicon. Well 52 is P-type doped. Well 52 is for example boron-doped. The dopant concentration in well 52 is for example in the range from $10^{14}$ to $5\times10^{15}$ at·cm^(−3).

Semiconductor block 51a comprises a well 58 located in well 52. Well 58 is similar to the well 22 of FIG. 1. Thus, well 58 is made of a semiconductor material, for example, of silicon. Well 58 is N-type doped (N+). Well 58 is for example phosphorus-doped. The dopant concentration in well 58 is greater than the dopant concentration in well 54. The dopant concentration in well 58 is for example in the range from $10^{18}$ to $10^{20}$ at·cm^(−3).

Preferably, well 58 extends from the level of the upper surface of well 52. Well 58 preferably extends along a height smaller than the height of well 52. Well 58 preferably extends along a height smaller than the height of walls 62. Well 58 preferably extends along a height smaller than the height of walls 56.

Semiconductor block 51b comprises a well 54. Well 54 is similar to the well 14 of FIG. 1. Thus, well 54 is made of a semiconductor material, for example, of silicon. Well 54 is N-type doped. Well 54 is for example phosphorus-doped. The dopant concentration in well 54 is for example in the range from $10^{14}$ to $5\times10^{15}$ at·cm^(−3).

Similarly, semiconductor block 51b comprises a well 60 located in well 54. Well 60 is similar to the well 24 of FIG. 1. Thus, well 60 is made of a semiconductor material, for example, of silicon. Well 60 is P-type doped (P+). Well 60 is for example, boron-doped. The dopant concentration in well 60 is greater than the dopant concentration in well 52. The dopant concentration in well 60 is for example in the range from $10^{18}$ to $10^{20}$ at·cm^(−3).

Blocks 51 and 51b are located next to each other in the direction of a column. Cell 50 comprises an insulating wall 56, for example, made of silicon oxide. Wall 56 extends in the direction of a bit line. Wall 56 at least partially separates blocks 51a and 51b. Preferably, wall 56 extends all along the length of cell 50, that is, all along cell 50 in the bit line direction. Preferably, wall 56 extends from the upper surface of wells 52 and 54, 58 and 60 and along wells 52 and 54, 58 and 60. Preferably, wall 56 extends along wells 52 and 54, 58, and 60 along a height smaller than the height of wells 52 and 54. Wells 52 and 54 are for example in contact with each other under wall 64. Preferably, wall 56 extends along wells 52, 54, 58, and 60 along a height greater than the height of wells 58 and 60. Thus, wells 58 and 60 are fully separated from the neighboring block 51a or 51b by wall 56.

Further, blocks 51a and 51b are separated from neighboring cells in the word line direction, that is, the column direction, by insulating walls 62. Preferably, walls 62 are identical to wall 56. Thus, cell 50 comprises, in the word line direction, a wall 62, block 51a, wall 56, block 51b, and another wall 62.

The memory column comprises a plurality of cells 50. The column thus comprises an alternation of semiconductor blocks 51a, 51b and of insulating walls 56, 62 separating the semiconductor blocks. Each block 51a is next to a block 51b with which it forms a cell 50 and from which it is separated by a wall 56. Each wall 62 thus separates a block 51a or 51b from a block 51a or 51b of another cell.

Cell 50 further comprises a wall 64. Wall 64 preferably comprises a conductive or semiconductor core 64a, for example, made of a metal or of a semiconductor material, preferably of polysilicon, and an insulating sheath 64b, preferably made of silicon oxide. Wall 64 for example extends in a direction orthogonal to walls 56 and 62. Wall 64 preferably extends in the word line direction. Wall 64 extends along wells 52 and 54. Wall 64 is in contact with wells 52 and 54. Preferably, wall 64 extends along the entire height of wells 52 and 54. Walls 56 and 62 preferably extend from wall 64.

Wall 64 for example separates the blocks 51a and 51b of a cell 50 from the blocks 51a and 51b of a cell 50 located in another column. Wall 64 is preferably common to all the cells in the column.

Preferably, wells 52 and 54 and wall 64 have lower surfaces coplanar to one another. Preferably, cell 50 comprises a layer 66 having the lower surfaces of wells 52 and 54 and of wall 64 resting thereon. Layer 66 is preferably made of a semiconductor material, for example, silicon, for example, N-type doped silicon. Layer 66 rests on a substrate 70, for example made of a semiconductor material.

Layer 66 is preferably common to all the memory cells of the type of cell 50 in a same memory array.

Well 58 is separated from wall 64 by a portion of well 52. In other words, a portion of well 52 is located between well 58 and wall 64. Wall 64 and well 58 are thus not in contact. Well 58 extends from the upper surface of well 52. Well 58 extends along a height smaller than the height of well 52. The upper surface of well 58 is preferably coplanar with the upper surface of wall 64 and of the portion of well 52 located between well 58 and wall 64.

Well 60 is separated from wall 64 by a portion of well 54. In other words, a portion of well 54 is located between well 60 and wall 64. Wall 64 and well 60 are thus not in contact. Well 60 extends from the upper surface of well 54. Well 60 extends along a height smaller than the height of well 54. The upper surface of well 60 is preferably coplanar with the upper surface of wall 64 and of the portion of well 54 located between well 60 and wall 64.

The doping type of well 52 is the type opposite to the doping type of well 54. Similarly, the doping type of well 58 is the type opposite to the doping type of well 60. Further, the doping type of well 58 is the type opposite to the doping type of well 52. The doping type of well 60 is the type opposite to the doping type of well 54. Thus, wells 58 and 54 have identical doping types and wells 60 and 52 have identical doping types.

Preferably, the dimensions of wells 52 and 54 are substantially identical. Similarly, the dimensions of wells 58 and 60 are identical.

Cell 50 further comprises a stack of an insulating layer 71, of a semiconductor layer 72, of an insulating layer 73, and of a conductive or semiconductor layer 74.

Layer 71 rests on the upper surface of wells 52 and 54. Layer 72 rests on layer 71. Preferably, layers 71 and 72 have substantially identical shapes and horizontal dimensions, that is, the dimensions in a plane parallel to plane A-A. Preferably, layer 72 entirely covers layer 71. Preferably, layer 71 continuously extends over the entire upper surface of wells 52 and 54 and over the upper surface of wall 56. Layer 71 extends, in the word line direction, across the entire width of wells 58 and 60. Preferably, layer 71 extends from one of walls 62 to the other wall 62. Layer 71 for example at least partially covers each wall 62 adjacent to cell 50. Layer 71 preferably extends in the bit line direction, from well 58 to wall 64. Preferably, layer 71 extends from the level of the contact area between wells 52 and 58 at the level of the contact area between well 52 and wall 64. Preferably, layer 71 does not rest on wells 58 and 60. Layer 71 separates layer 72 from wells 52 and 54.

Layer 73 covers layers 71 and 72. Preferably, layer 73 covers the upper surface of layer 72 and lateral surfaces of layers 71 and 72, for example, lateral surfaces located in the array column direction.

Layer 74 is for example made of polysilicon. Layer 74 preferably entirely covers layer 72. Preferably, layer 74 has a dimension, in the bit line direction, substantially equal to the dimension of layer 72 in the bit line direction.

Preferably, the dimension of layer 74 in the word line direction is greater than the dimension of layer 72 in the word line direction. Preferably, layer 74 is common to a plurality of cells of a same column, preferably to all the cells of a column. Thus, layer 74 preferably covers the layers 72 of a plurality of cells of a same column, and covers the walls 62 separating said cells and the walls 56 separating the blocks of the different cells.

The cell further comprises contact elements 76 and 78, for example, conductive vias. Elements 76 and 78 are for example made of a metal. Element 76 is in contact with well 58 and element 78 is in contact with well 60. Elements 76 and 78 are preferably not in contact with layers 72 and 74. Element 76 is preferably not in contact with well 52. Element 78 is preferably not in contact with well 54.

The operation of cell 50 is identical to the operation of the cell 10 of FIG. 1. At each operating step previously described in FIGS. 2, 3, and 4:

the potential of well 52 corresponds to the potential of well 12,
the potential of well 54 corresponds to the potential of well 14,
the potential of well 58 corresponds to the potential of well 22,
the potential of well 60 corresponds to the potential of well 24,
the potential of layer 74 corresponds to the potential of layer 28,
the potential of layer 66 corresponds to the potential of layer 18, and
the potential of wall 64 corresponds to the potential of wall 16.

FIGS. 7 to 11 illustrate steps, preferably successive, of a method of manufacturing a memory cell 10 according to the embodiment of FIG. 1. FIGS. 7 to 11 further illustrate a method of manufacturing a conventional eSTM cell and a MOSFET transistor, with an N channel in this example. FIGS. 7 to 11 thus illustrate the co-integration of a cell 10 according to the embodiment of FIG. 1 with an eSTM cell and a MOSFET transistor. The method of manufacturing cell 10 may be carried out without the manufacturing of the eSTM cell and of the transistor.

Each of FIGS. 7 to 11 comprises views A1, B1, C1, A2, B2, and C2. Views A1, B1, and C1 are cross-section views in the bit line direction. Views A2, B2, and C2 are cross-section views in the word line direction. More precisely, views A1 are cross-section views in the bit line direction, along a plane AA of view A2, illustrating the manufacturing of an eSTM cell. Views A2 are cross-section views in the word line direction, along a plane DD of view A1, of the structure of the view A1 of the same drawing. Views B1 are cross-section views in the bit line direction, along a plane BB of view B2, illustrating the manufacturing of a cell according to the embodiment of FIG. 1. Views B2 are cross-section views in the word line direction, along a plane EE of view B1, of the structure of the view B1 of the same figure. Views C1 are cross-section views in the bit line direction, along a plane CC of view C2, illustrating the manufacturing of a MOSFET transistor. Views C2 are cross-section views in the word line direction, along a plane FF of view C1, of the structure of the view C1 of the same figure.

Views A1, B1, and C1, respectively A2, B2, and C2, are shown separately, but may in principle be located next to one another.

Views A2 and B2 each illustrate the forming of two neighboring cells in the word line direction. View A1 illustrates the forming of two neighboring cells in the bit line direction.

Figure 7:
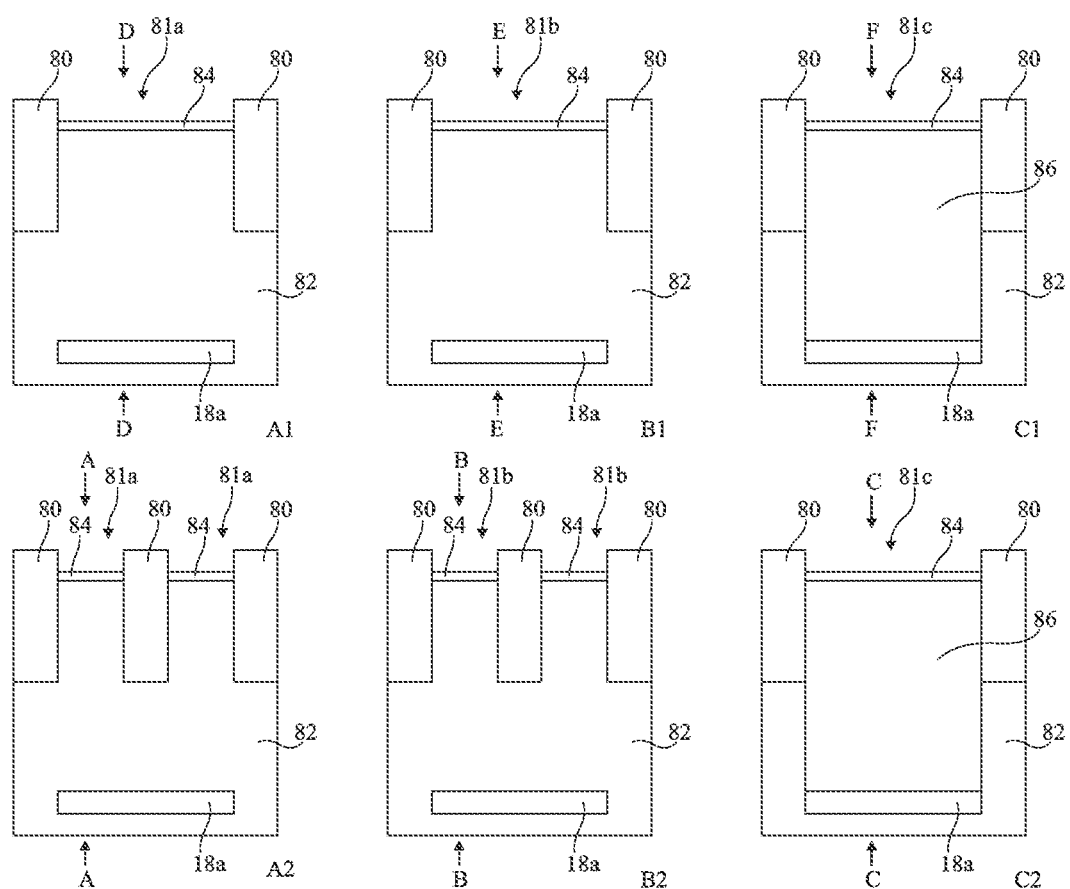
FIG. 7 illustrates a step of a method for manufacturing the embodiment of FIG. 1.

FIG. 7 illustrates a step of a method of manufacturing the embodiment of FIG. 1.

During this step, insulating walls 80 are formed in a semiconductor substrate 82. The insulating walls are preferably of shallow trench insulation or STI type. Trenches 80 extend in the bit line direction and other trenches 80 extend in the word line direction to surround the locations where the eSTM cell, cell 10, and the transistor are formed. Walls 80 thus delimit locations 81a, 81b, and 81c, where an eSTM cell, a cell 10, and a MOSFET transistor are respectively formed. The walls 80 of views B1 and B2 correspond to the walls 25 of FIG. 1.

Preferably, walls 80 protrude from substrate 82. In other words, walls 80 extend vertically in substrate 82 and out of substrate, from the level of an upper surface of the substrate. Preferably, walls 80 do not extend along the entire height of the substrate. For example, walls 80 protrude from the substrate along a height substantially equal to 10 nm. For example, walls 80 extend in substrate 82 along a height substantially equal to 350 nm.

Further, during this step, an insulating layer 84 is formed on the upper surface of the substrate. Layer 84 is for example made of silicon oxide. Layer 84 is for example formed simultaneously in locations 81a, 81b, and 81c, by growth on the substrate. Layer 84 preferably has a thickness smaller than the height by which walls 80 protrude from the substrate. Thus, layer 84 is, at the level of the eSTM cells, of cells 10, and of the transistors, surrounded with walls 80.

This step further comprises the forming of layers 18a by implantation of dopants into the substrate. Layers 18 are preferably made of a semiconductor material, for example, silicon, for example, N-type doped silicon. Each location 81a, 81b, and 81c comprises a layer 18a. The layers 18a of the different locations are for example formed during a same implantation.

Layers 18a are formed under the level of the lower surface of walls 80. Thus, layers 18a are located deeper in the substrate than walls 80, with respect to the upper surface of the substrate. For example, layers 18a have a thickness in the range from 1 μm to 10 μm. For example, layers 18a are separated from the level of the lower surface of walls 80 by a distance in the range from 0.5 μm to 1 μm.

The implantation of dopants is for example performed in locations 81a, 81b, and 81c, between walls 80.

Layers 18a preferably extend in front of the entire upper surface of the substrate located in locations 81a, 81b, 81c.

For example, two neighboring cells eSTM in the word line direction may, as shown in view A2, share a same layer 18a. Layer 18a thus extends under the wall 80 located between two eSTM cells. Similarly, two neighboring cells 10 in the word line direction may, as shown in view B2, share a same layer 18a. Layer 18a thus extends under the wall 80 located between the two cells 10. More generally, layers 18 for example extend under the walls 80 located between memory cells comprising a common semiconductor well (formed afterwards), but which do not extend under the walls 80 separating a cell from a component, for example, a cell or a transistor, with which it does not share a semiconductor well.

This step further comprises the forming of a well 86 in location 81c. More precisely, the forming of well 86 corresponds to the doping of substrate 82 in location 81c. Well 86 is for example P-type doped, for example at a concentration in the range from $10^{14}$ to $5\times10^{15}$ at·cm$^{\wedge}$(−3). Well 86 preferably extends from layer 84 to the layer 18a of location 81c. Thus, well 86 preferably extends, in location 81c, from the upper surface of the substrate to the upper surface of layer 18a. For example, locations 81a and 81b are covered with a protection mask on forming of well 86, the mask being removed after the forming of well 86.

Figure 8:
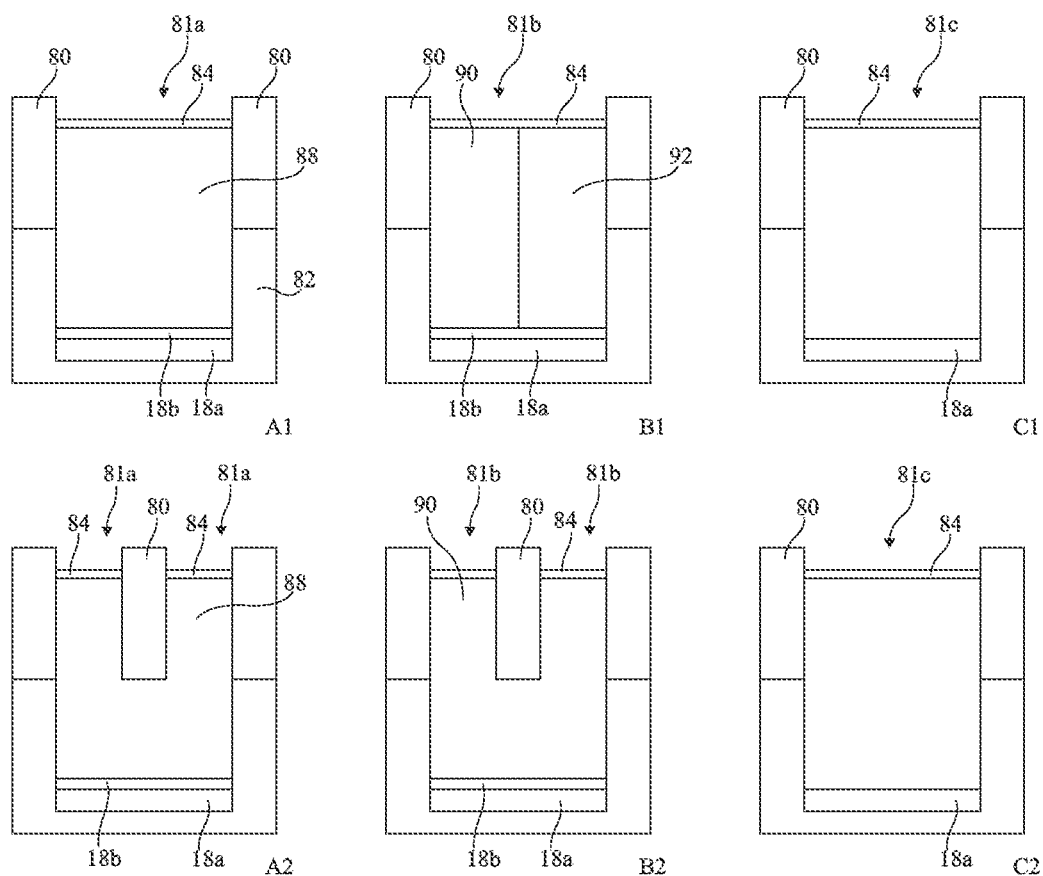
FIG. 8 illustrates another step of a method for manufacturing the embodiment of FIG. 1.

FIG. 8 illustrates a step of a method of manufacturing the embodiment of FIG. 1.

This step comprises the forming of layers 18b in locations 81a and 81b. Layers 18b rest on layers 18a. Preferably, layers 18b entirely cover the layers 18a of locations 81a and 81b. Preferably, layers 18b are in contact with the layers 18a of locations 81a and 81b. Layers 18b are made of N-type doped silicon. Layers 18b are for example doped with the same dopants as layers 18a and at a dopant concentration in the same order of magnitude.

Layers 18b are located between the level of the lower surfaces of walls 80 and layers 18a. Layers 18b are thus located deeper than the lower ends of walls 80. Preferably, each layer 18b is separated from the upper surface by a distance substantially equal to 500 nm.

The stack of layers 18a and 18b corresponds, in location 81b, to layer 18.

This manufacturing step further comprises the forming of wells 88 and 90. Well 88 is located in location 81a and well 90 is located in location 81b. Wells 88 and 90 are for example simultaneously formed during a same implantation step.

Well 88 preferably extends from layer 18b to layer 84, in other words from the upper surface of layer 18 to the upper surface of substrate 82. Preferably, the entire region of substrate 82 located in location 81a, above layers 18a and 18b, is doped to form well 88.

Well 88 is for example P-type doped, for example, boron-doped. The dopant concentration is for example in the range from $10^{14}$ to $5 \times 10^{15}$ at·cm^(−3).

In the case where certain eSTM cells share a same layer 18a, as in view A1 and A2, layer 18b extends under the wall 80 located between said cells and the substrate region between said wall 80 and layer 18b is doped on forming of the well. Thus, well 88 extends between layer 18b and the wall 80 located between said eSTM cells.

Well 90 extends, in location 81b, preferably from layer 18b to layer 84, in other words from the upper surface of layer 18 to the upper surface of substrate 82. Preferably, the entire region of substrate 82 located in location 81b, above layers 18a and 18b, is doped to form well 90.

Well 90 is for example P-type doped, for example, boron-doped. The dopant concentration is for example in the range from $10^{14}$ to $5 \times 10^{15}$ at·cm^(−3). The dopant concentration is for example substantially equal to the dopant concentration in well 88. The dopant concentration is preferably equal to the concentration of the well 12 of FIG. 1.

In the case where certain cells 10 share a same layer 18a, as in view B1 and B2, layer 18b extends under the wall 80 located between said cells and the substrate region between said wall 80 and layer 18b is doped on forming of well 90. Thus, well 90 extends between layer 18b and the wall 80 located between said cells 10.

This step further comprises the forming of a well 92 in the well 90 of location 81b. Well 92 for example extends along the same height as well 90, that is, from layer 18b to the upper surface of the substrate. Well 92 further extends from one of walls 80 to the other wall 80, in the plane of view B1, that is, in the bit line direction. Preferably, well 92 occupies a lateral half of well 90.

Well 92 corresponds to the well 14 of FIG. 1 and the portion of well 90 which is not replaced by well 92 corresponds to well 12.

Figure 9:
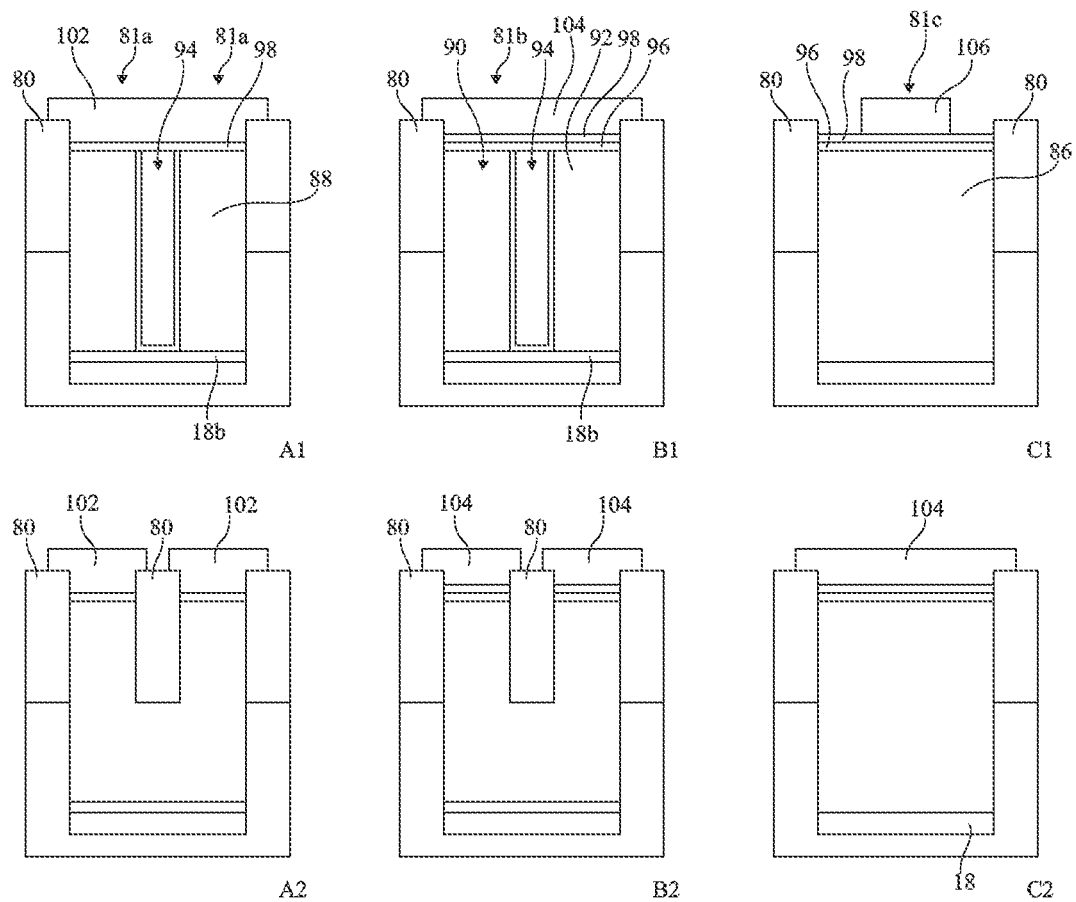
FIG. 9 illustrates another step of a method for manufacturing the embodiment of FIG. 1.

FIG. 9 illustrates a step of a method of manufacturing the embodiment of FIG. 1.

During this step, layer 84 is removed from locations 81a, 81b, and 81c. Further, walls 94 are formed in locations 81a and 81b.

Each wall 94 extends heightwise from layer 18b to the upper surface of the substrate. In other words, each wall 94 extends along the entire height of well 88 or 90. Each wall 94 extends in the word line direction. Preferably, each wall 94 is common to a plurality of eSTM cells or cells 10. Each wall 94 thus crosses the walls 80 located between neighboring cells in the word line direction. Thus, the two eSTM cells of view A2 have a common wall 94, wall 94 crossing the wall 80 separating said cells. Similarly, the two cells 10 of view B2 have a common wall 94, wall 94 crossing the wall 80 separating said cells.

Each wall 94 is located substantially in the middle, in the plane of views A1 and B1, of the location 81a or 81b where it is located. Thus, each wall 84 is substantially at the same distance from two opposite walls 80, surrounding location 81a or 81b, parallel to each other, and parallel to wall 94.

The wall 94 located in location 81a separates well 88 into two wells substantially of same dimensions, separated by wall 94, each of the two wells extending in the word line direction.

The wall 94 located in location 81b, corresponding to the wall 16 of FIG. 1, separates well 90 and well 92, corresponding to the wells 12 and 14 of FIG. 1.

Walls 94 are preferably formed simultaneously. Walls 94 are preferably identical to one another. Each wall 94 comprises a conductive or semiconductor core, for example, made of polysilicon, and an insulating sheath, for example, made of silicon oxide.

This step further comprises the forming of an insulating layer 96 in locations 81b and 81c. Layer 96 is for example made of silicon oxide. Layer 96 preferably extends all over the upper surface of the substrate in locations 81a and 81b. Thus, in location 81c, layer 96 extends between walls 80, to cover well 86. In location 81b, layer 96 extends between walls 80, to cover well 90, well 92, and wall 94.

This step further comprises the forming of an insulating layer 98 in locations 81a and 81b. Layer 98 is for example made of silicon oxide. Layer 98 preferably extends in front of the entire upper surface of the substrate in locations 81a and 81b. Thus, in location 81a, layer 96 extends between walls 80, to cover well 88 and wall 94. In location 81b, layer 96 extends between walls 80, to entirely cover layer 96, and thus extend in front of well 90, well 92, and wall 94.

Layer 96 for example has a thickness in the range from 7 to 8 nm. Layer 98 for example has a thickness in the range from 7 to 8 nm. More generally, the thicknesses of layers 96 and 98 are such that the stack of layers 96 and 98 does not protrude out of the walls.

This step further comprises the forming of a semiconductor layer, preferably made of polysilicon. Said layer is for example formed over the entire structure, in particular in locations 81a, 81b, and 81c, and on walls 80. Said layer is for example smoothed, for example, by a chemical mechanical polishing (CMP), so that the upper surface of said layer is planar. Said layer is then etched to form strips 102 in locations 81a, strips 104 in locations 81b, and strips 106 in locations 81c. Strips 102, 104, and 106 are preferably formed simultaneously during a same layer etching step.

Each strip 102 or 104 entirely covers the location 81a, 81b where it is located. Further, strips 102 and 104 partially covers the walls 80 delimiting locations 81a and 81b. Preferably, strips 102, 104, and 106 are not in contact with the other strips 102, 104, or 106.

In the case where eSTM cells and cells 10 are next to one another, that is, if locations 81a and 81b are next to each other, the layers 102 and 104 of the neighboring cells may be common.

Strips 106 are formed to form the transistor gates. Thus, the strip 106 of a location 81c extends all along the length, that is, the dimension in the word line direction, of location 81c, and at least partially on the walls 80 delimiting location 81c in the word line direction. The strip 106 of a location 81c extends partially across the width, that is, the dimension in the bit line direction, of location 81c, preferably at the center of location 81c. A portion of wells 86 is not in front of strips 106. More precisely, the regions corresponding to the source and drain regions of the transistors are not opposite strips 106.

Figure 10:
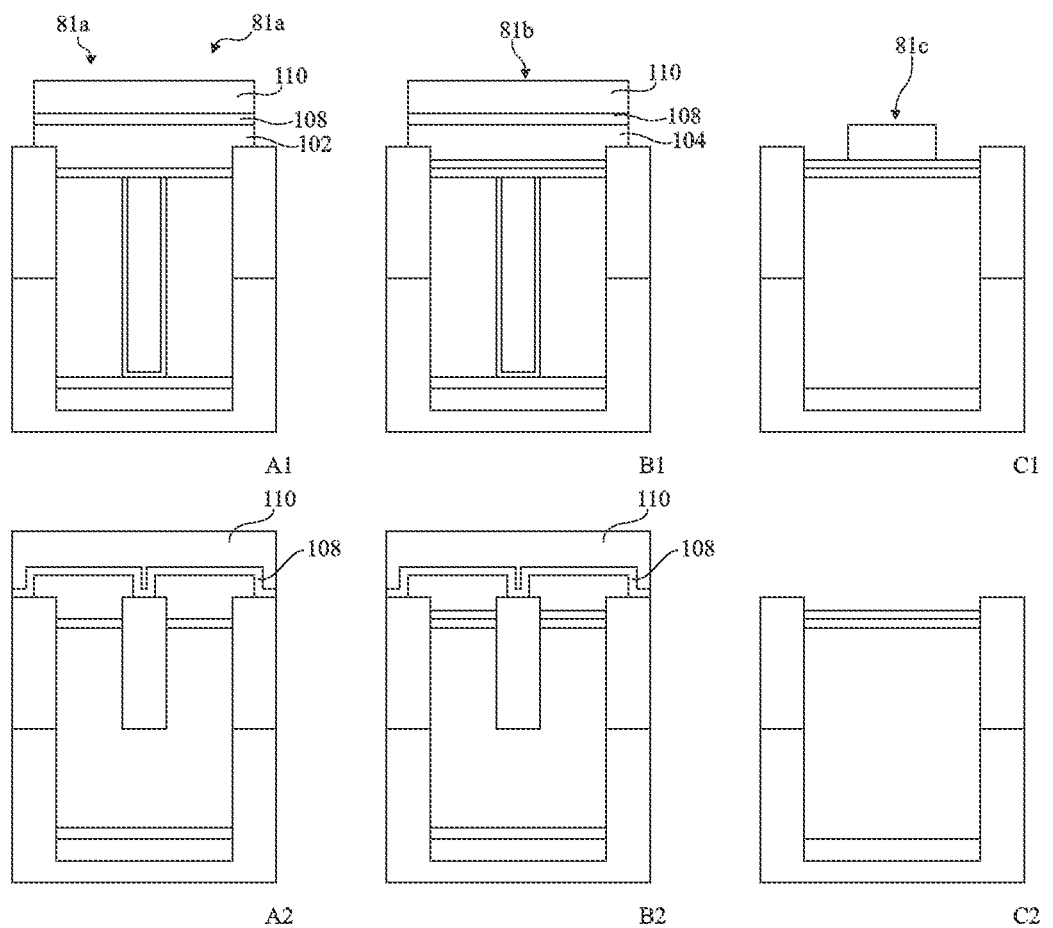
FIG. 10 illustrates another step of a method for manufacturing the embodiment of FIG. 1.

FIG. 10 illustrates a step of a method of manufacturing the embodiment of FIG. 1.

During this step, an insulating layer 108 is formed over the entire structure. Layer 108 is preferably a stack of a silicon oxide layer, of a silicon nitride layer, and of a silicon oxide layer. A semiconductor layer 110, preferably made of polysilicon, is for example formed over the entire structure, in particular in locations 81a, 81b, and 81c, and on walls 80. Said layer thus covers layer 108. Layer 110 is for example smoothed, for example, by a chemical mechanical polishing (CMP), so that the upper surface of layer 110 is planar.

In the case where eSTM cells and cells 10 are next to one another, that is, if locations 81a and 81b are next to each other, the layers 108 and 110 of the neighboring cells may be common.

Layers 108 and 110 are then etched, preferably simultaneously. Layers 108 and 110 are then entirely etched from locations 81c.

Figure 11:
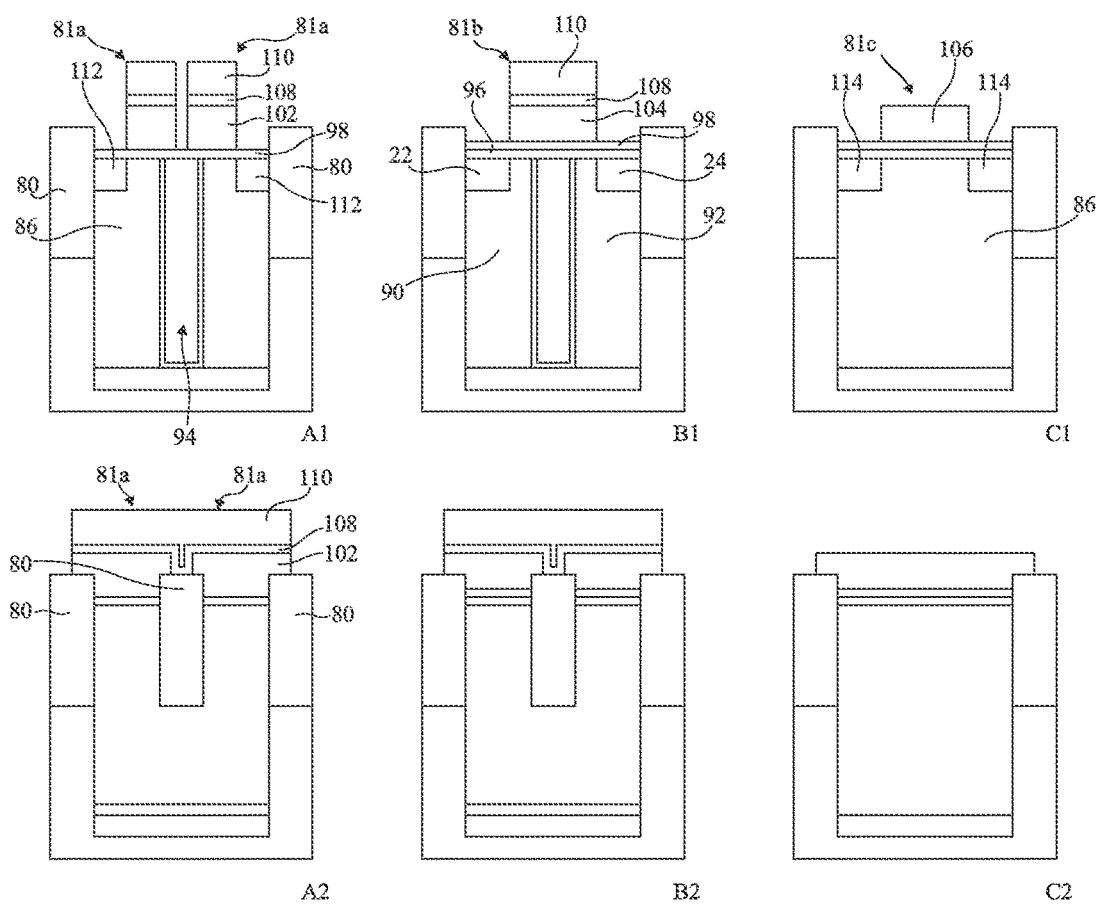
FIG. 11 illustrates another step of a method for manufacturing the embodiment of FIG. 1.

FIG. 11 illustrates a step of a method of manufacturing the embodiment of FIG. 1.

During this step, the stacks of layers 102, 108, and 110 in locations 81a and the stacks of layers 104, 108, and 110 in locations 81b are etched. More precisely, the stacks of layers 104, 108, and 110 in locations 81b are etched to form the stack of layers 26, 29, and 28 of FIG. 1. Thus, the layers 96 and 98 of location 81b correspond to the layer 27 of FIG. 1, the layer 104 of location 81b corresponds to the layer 26 of FIG. 1, the layer 108 of location 81b corresponds to the layer 29 of FIG. 1, and the layer 110 of location 81b corresponds to the layer 28 of FIG. 1.

The stack of layers 102, 108, and 110 in location 81A is etched to form two stacks, preferably identical, comprising layer 102, layer 108, and layer 110. Thus, each eSTM cell, that is, each location 81a, comprises a stack of a layer 102, of a layer 108, and of a layer 110. Said stack of each eSTM cell extends, in the word line direction, that is, in the plane of view A2, from a wall 80 delimiting location 81a, to the opposite wall 80 delimiting location 81a. Said stack of each eSTM cell extends, in the bit line direction, that is, in the plane of view A1, partially on the upper surface of well 88, on one side of wall 94. Thus, two stacks are shown in view A1, the stacks being located on layer 98, one on each side of wall 94. Each stack extends, in the bit line direction, from wall 94 to wall 80. Each stack extends, in the bit line direction, partially opposite the portion of well 88 on the same side of wall 94. Thus, on each side of wall 94, a portion of well 88 is not in front of the stack, said portion being preferably along a wall 80, separated from wall 94 by a portion of well 88 covered with the stack. Preferably, the stack is not located opposite wall 94.

The layers 102 of each cell are independent from the layers 102 of the other cells. In particular, layers 102 are separated from one another by layer 108. Each layer 110 is for example common to neighboring cells in the word line direction.

This step further comprises a step of implantation of wells more heavily doped at the substrate surface. More precisely, this step comprises the implantation of N-type dopants:

in locations 81a, to form wells 112 at the surface of wells 88, in the regions which are not in front of stacks of layers 102, 108, and 110;

in locations 81b, to form well 22 in well 90, that is, in well 12 (FIG. 1); and in locations 81c, to form source and drain regions 114 in the regions of well 86 which are not covered with layer 106.

Wells 112, 22, 24, and 114 are preferably formed simultaneously, during a same implantation step. Wells 112, 22, 24, and 114 thus preferably have a same dopant concentration.

Further, this step also comprises the implantation of P-type dopants in location 81b, to form well 24 in well 92, that is, well 14 (FIG. 1).

An advantage of the cells 10 formed by the method described by FIGS. 7 to 11 is that the thickness of insulating layer 27 (FIG. 1), corresponding to the stack of layer 96 and of layer 98 (FIG. 9), is thicker than the oxide layer of a known eSTM cell, which causes a better reliability.

An advantage of the previously-described embodiments is that it is possible to erase each cell independently from the other cells of the row of the array and of the column of the array.

Another advantage of the described embodiments is that the potentials used during the erasing step may be adapted to the device. Thus, it is possible to use positive potentials only, negative potentials only, or positive and negative potentials, but relatively close to ground.

Another advantage of the described embodiments is that they are more reliable than known eSTM memories, due to the oxide thickness.

Various embodiments and variants have been described. Those skilled in the art will understand that certain features of these various embodiments and variants may be combined, and other variants will occur to those skilled in the art. In particular, the transistor formed by the method of FIGS. 7 to 11 may be a P-channel transistor. The manufacturing method only differs in that well 86 is N-type doped and that wells 114 are P-type doped and are formed on implantation of P-type dopants forming well 24.

Finally, the practical implementation of the described embodiments and variants is within the abilities of those skilled in the art based on the functional indications given hereabove.

What is claimed is:

1. A memory cell comprising:
   a first doped well of a first conductivity type in contact with a second doped well of a second conductivity type, the second conductivity type being opposite to the first conductivity type;
   a third doped well of the second conductivity type in contact with a fourth doped well of the first conductivity type;
   a first wall in contact with the second and fourth doped wells, the first wall comprising a conductive or semiconductor core and an insulating sheath;
   a stack of layers comprising a first insulating layer, a first semiconductor layer, a second insulating layer and a second semiconductor layer at least partially covering the second and fourth doped wells; and
   a third semiconductor layer located below the second and fourth doped wells and the first wall.

2. The memory cell according to claim 1, wherein the first conductivity type is a N type and the second conductivity type is a P type.

3. The memory cell according to claim 1, wherein the second and fourth doped wells are separated by the first wall.

4. The memory cell according to claim 3, wherein the stack of layers covers the first wall.

5. The memory cell according to claim 1, wherein the third semiconductor layer is separated from the fourth doped well by a doped semiconductor well of the second conductivity type.

6. The memory cell according to claim 1, wherein the second and fourth doped wells are separated by a second insulating wall.

7. The memory cell according to claim 6, wherein the stack of layers covers the second insulating wall.

8. A memory comprising:
   an array of memory cells according to claim 1,
   wherein each column of the array comprises a respective second semiconductor layer and a respective first wall common to cells of a column.

9. A method for controlling the memory cell according to claim 1, the method comprising:

setting the second, third, and fourth doped wells and the third semiconductor layer to a first reference potential;

setting the first doped well to a second positive potential, the second positive potential being greater than the first reference potential;

setting the second semiconductor layer to a third positive potential, the third positive potential being greater than the second positive potential; and setting the first wall to a fourth potential equal to a threshold voltage of a transistor comprising the first, second, and third doped wells and the stack of layers, wherein controlling comprises programming.

10. The method according to claim 9, wherein the first reference potential is ground, the second positive potential is substantially equal to 5 V, the third positive potential is substantially equal to 12 V, and the fourth potential is in a range from 0.5 V to 1.5 V.

11. A method for controlling the memory cell according to claim 1, the method comprising:

setting the second, third, and fourth doped wells and the second semiconductor layer and the third semiconductor layer to a fifth reference potential;

setting the first doped well to a sixth positive potential, the sixth positive potential being greater than the fifth reference potential; and setting the first wall to a seventh positive potential, the seventh positive potential being greater than the sixth positive potential, wherein controlling comprises reading.

12. The method according to claim 11, wherein the fifth reference potential is ground, the sixth positive potential is substantially equal to 0.7 V, and the seventh positive potential is substantially equal to 3 V.

13. A method for controlling the memory cell according to claim 1, the method comprising:

setting the first, second and third doped wells and the third semiconductor layer to an eighth reference potential;

setting the fourth doped well to a ninth potential, the ninth potential being smaller than the eighth reference potential;

setting the second semiconductor layer to a tenth potential, the tenth potential being smaller than the ninth potential; and setting the first wall to an eleventh potential equal to a threshold voltage of a transistor comprising the second, third, and fourth doped wells and the stack of layers, wherein controlling comprises erasing.

14. The method according to claim 13, wherein the eighth reference potential is ground, the ninth potential is substantially equal to −5 V, the tenth potential is substantially equal to −10 V, and the eleventh potential is in a range from −1.5 V to −0.5 V.

15. The method according to claim 13, wherein the eighth reference potential is substantially equal to 10 V, the ninth potential is substantially equal to 5 V, the tenth potential is ground, and the eleventh potential is in a range from 5 V to 15 V.

16. The method according to claim 13, wherein the eighth reference potential is substantially equal to 5 V, the ninth potential is ground, the tenth potential is substantially equal to −5 V, and the eleventh potential is in a range from 0 V to 15 V.

17. A method for manufacturing the memory cell according to claim 1, the method comprising:

a. forming the third semiconductor layer by implanting layer dopants into a semiconductor substrate;

b. forming the second doped well by implanting second dopants into the semiconductor substrate;

c. forming the fourth doped well by implanting fourth dopants into the semiconductor substrate;

d. forming the first wall between the second and third doped wells;

e. forming the stack of layers on a portion of the second and fourth doped wells and on the first wall;

f. forming the first doped well by implanting first dopants into the second doped well; and g. forming the third doped well by implanting dopants into the fourth doped well.

18. The method according to claim 17, wherein a first memory cell is formed by a, b, c, d, e, f, and g, and wherein a second memory cell is formed by a, b, d, e and f.

19. The method according to claim 17, wherein a first memory cell is formed by a, b, c, d, e, f, wherein a gate of a transistor is formed by e, and wherein drain and source regions are formed by f or g.

* * * * *